US012683232B2

(12) United States Patent
Wang et al.

(10) Patent No.: US 12,683,232 B2
(45) Date of Patent: Jul. 14, 2026

(54) TRACTION BATTERY WITH HURDLE-SHAPED FLEXIBLE PRINTED CIRCUIT

(71) Applicant: FORD GLOBAL TECHNOLOGIES, LLC, Dearborn, MI (US)

(72) Inventors: Yongcai Wang, Ann Arbor, MI (US); Brian Utley, Canton, MI (US); Chi Paik, Grosse Ile, MI (US); Dean Joseph Deangelis, Livonia, MI (US); Mark Parenti, Clinton Township, MI (US); Francisco Fernandez-Galindo, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 558 days.

(21) Appl. No.: 18/355,831

(22) Filed: Jul. 20, 2023

(65) Prior Publication Data

US 2025/0030110 A1      Jan. 23, 2025

(51) Int. Cl.
*H01M 50/284* (2021.01)
*H05K 1/11* (2006.01)
*H05K 1/189* (2026.01)

(52) U.S. Cl.
CPC .......... *H01M 50/284* (2021.01); *H05K 1/118* (2013.01); *H05K 1/189* (2013.01); *H01M 2220/20* (2013.01)

(58) Field of Classification Search
CPC ............ H01M 50/284; H01M 2220/20; H05K 1/118; H05K 1/189
See application file for complete search history.

(56) References Cited

U.S. PATENT DOCUMENTS

| | | | |
|---|---|---|---|
| 10,777,987 | B2 | 9/2020 | Tian et al. |
| 2020/0067394 | A1 | 2/2020 | Ishikawa et al. |
| 2020/0091494 | A1* | 3/2020 | Fernandez-Galindo ..................... H01M 10/425 |

FOREIGN PATENT DOCUMENTS

DE        102011000862 A1      3/2012

* cited by examiner

*Primary Examiner* — Sarah A. Slifka
(74) *Attorney, Agent, or Firm* — David B. Kelley; Brooks Kushman P.C.

(57) ABSTRACT

A traction battery includes a battery array and a flexible printed circuit (FPC). The FPC including a hurdle-shaped flexible substrate that is planar and has opposing first and second planar surfaces and opposing first and second edges extending between the planar surfaces, the substrate having a straight middle portion, a first end portion that is joined to the middle portion by a first elbow portion, and a second end portion that is joined to the middle portion by a second elbow portion. The elbow portions are folded relative to the middle portion at first and second folds, respectively, such that the first planar surfaces of the first and second elbows face each other. A circuit is supported by the substrate and electrically connected between circuit boards supported on opposite sides of the battery array.

20 Claims, 4 Drawing Sheets

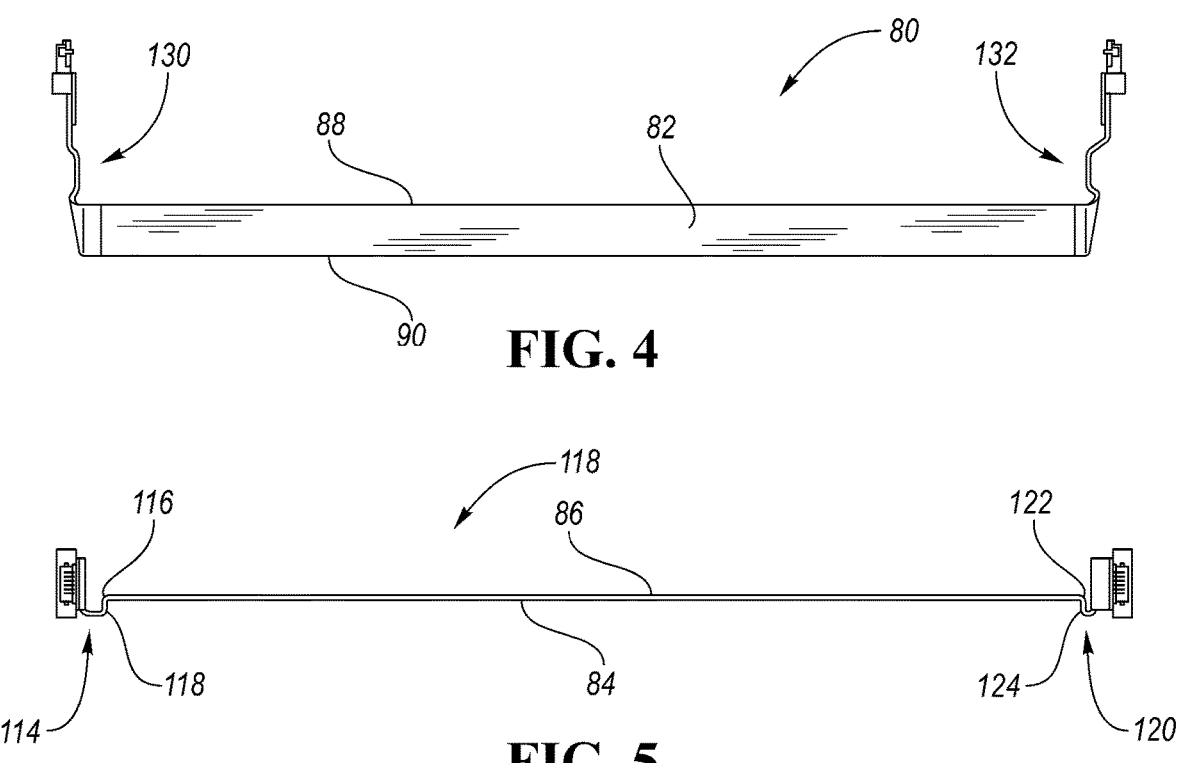
FIG. 4
FIG. 5
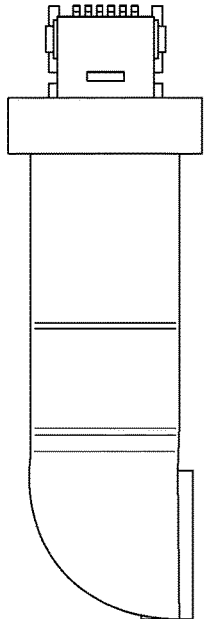
FIG. 6

TRACTION BATTERY WITH HURDLE-SHAPED FLEXIBLE PRINTED CIRCUIT

TECHNICAL FIELD

This application relates to traction batteries for vehicles and more particularly to a hurdle-shaped flexible printed circuit used on traction batteries.

BACKGROUND

Vehicles such as battery-electric vehicles and hybrid-electric vehicles contain a traction battery assembly to act as an energy source for the vehicle. The traction battery may include components and systems to assist in managing vehicle performance and operations. The traction battery may also include high-voltage components, and may include an air or liquid thermal-management system to control the temperature of the battery.

SUMMARY

According to one embodiment, a traction battery includes a battery array and a flexible printed circuit (FPC). The FPC including a hurdle-shaped flexible substrate that is planar and has opposing first and second planar surfaces and opposing first and second edges extending between the planar surfaces, the substrate having a straight middle portion, a first end portion that is joined to the middle portion by a first elbow portion, and a second end portion that is joined to the middle portion by a second elbow portion. The elbow portions are folded relative to the middle portion at first and second folds, respectively, such that the first planar surfaces of the first and second elbows face each other. A circuit is supported by the substrate and electrically connected between circuit boards supported on opposite sides of the battery array.

According to another embodiment, a traction battery includes a battery array, a first circuit board disposed on a first side of the array and having an associated temperature sensor, a second circuit board disposed on a second side of the array and having an associated sensing module, and a flexible printed circuit (FPC) extending from the first side to the second side of the array. The FPC including a hurdle-shaped flexible substrate that is planar and has opposing first and second planar surfaces and opposing first and second edges extending between the planar surfaces, the substrate having a straight middle portion, a first end portion that is joined to the middle portion by a first elbow portion, and a second end portion that is joined to the middle portion by a second elbow portion, wherein each of the elbow portions are folded relative to the middle portion such that the first planar surfaces of the first and second elbows face each other, a circuit supported by the substrate, a first connector attached to the circuit and the substrate and connected to the first circuit board, and a second connector attached to the circuit and the substrate and connected to the second circuit board such that the FPC electrically connects the temperature sensor to the sensing module.

According to yet another embodiment, a flexible printed circuit (FPC) of a traction battery includes a hurdle-shaped flexible substrate that is planar and has opposing first and second planar surfaces and opposing first and second edges extending between the planar surfaces. The substrate has a straight middle portion, a first end portion that is joined to the middle portion by a first elbow portion, and a second end portion that is joined to the middle portion by a second elbow portion. Each of the elbow portions are folded relative to the middle portion such that the first planar surfaces of the first and second elbows face each other. A circuit is supported by the substrate. A first connector is attached to the circuit at the first end portion, and a second connector is attached to the circuit at the second end portion.

BRIEF DESCRIPTION OF THE DRAWINGS

FIG. 4 is a front view of the FPC in the installation configuration.

FIG. 5 is a top view of the FPC in the installation configuration.

FIG. 6 is a side view of the FPC in the installation configuration.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
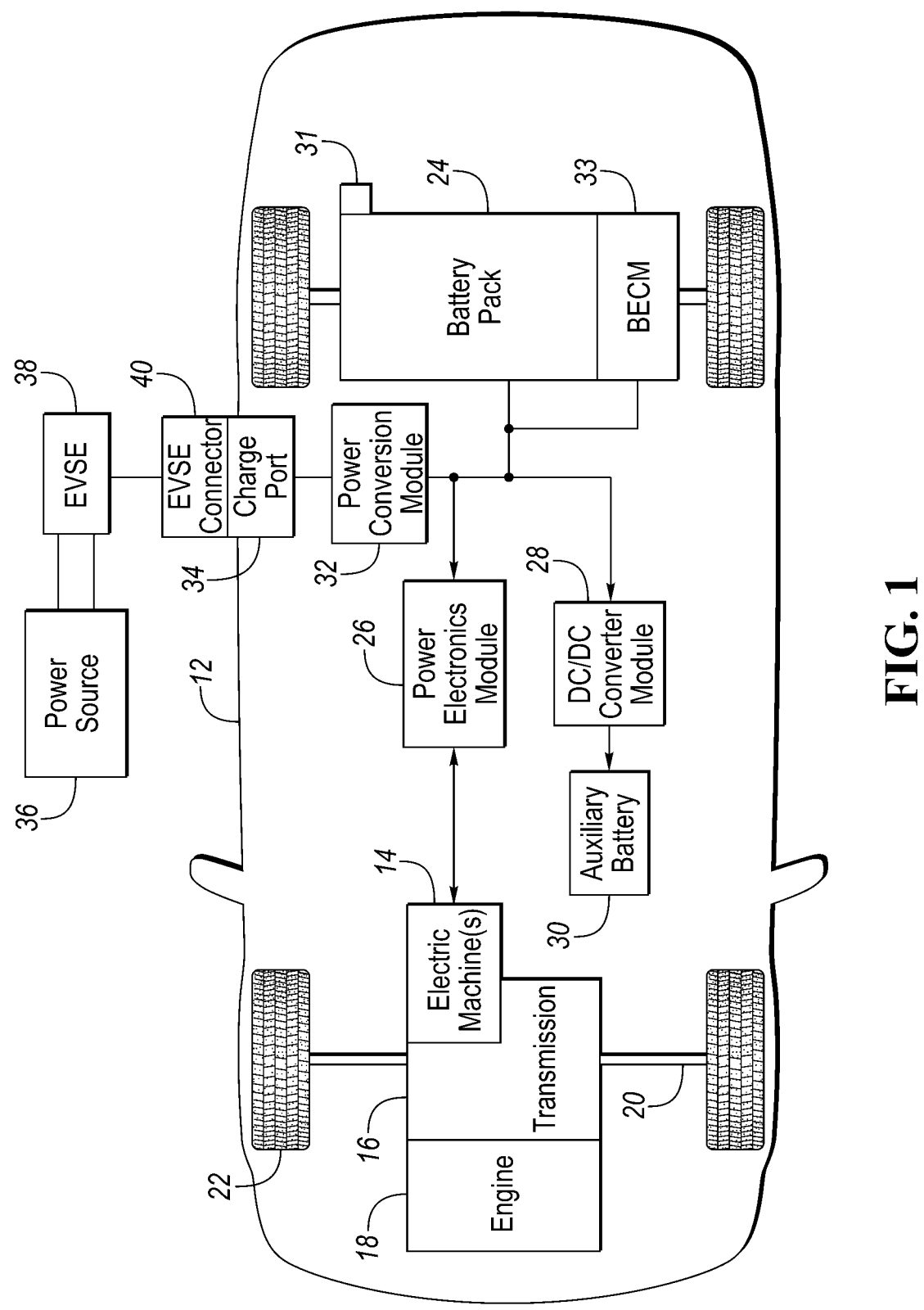
FIG. 1 is a schematic diagram of an example hybrid vehicle.

FIG. 1 depicts a schematic of a plug-in hybrid-electric vehicle (PHEV). Certain embodiments, however, may also be implemented within the context of non-plug-in hybrids and fully electric vehicles. The vehicle 12 includes one or more electric machines 14 mechanically connected to a hybrid transmission 16. The electric machines 14 may be capable of operating as a motor or a generator. In addition, the hybrid transmission 16 may be mechanically connected to an engine 18. The hybrid transmission 16 may also be mechanically connected to a drive shaft 20 that is mechanically connected to the wheels 22. The electric machines 14 can provide propulsion and braking capability when the engine 18 is turned on or off. The electric machines 14 also act as generators and can provide fuel economy benefits by recovering energy through regenerative braking. The electric machines 14 reduce pollutant emissions and increase fuel economy by reducing the workload of the engine 18.

A traction battery or battery pack 24 stores energy that can be used by the electric machines 14. The traction battery 24 typically provides a high-voltage direct current (DC) output from one or more battery cell arrays, sometimes referred to as battery cell stacks, within the traction battery 24. The battery cell arrays include one or more battery cells.

The battery cells, such as a prismatic, pouch, cylindrical, or any other type of cell, convert stored chemical energy to electrical energy. The cells may include a housing, a positive electrode (cathode), and a negative electrode (anode). An electrolyte allows ions to move between the anode and cathode during discharge, and then return during recharge. Terminals may allow current to flow out of the cell for use by the vehicle.

Different battery pack configurations may be available to address individual vehicle variables including packaging constraints and power requirements. The battery cells may be thermally controlled with a thermal management system. Examples of thermal management systems include: air cooling systems, liquid cooling systems, and a combination of air and liquid systems.

The traction battery 24 may be electrically connected to one or more power electronics modules 26 through one or more contactors (not shown). The one or more contactors isolate the traction battery 24 from other components when opened and connect the traction battery 24 to other components when closed. The power electronics module 26 may be electrically connected to the electric machines 14 and may provide the ability to bi-directionally transfer electrical energy between the traction battery 24 and the electric machines 14. For example, a typical traction battery 24 may provide a DC voltage while the electric machines 14 may require a three-phase alternating current (AC) voltage to function. The power electronics module 26 may convert the DC voltage to a three-phase AC voltage as required by the electric machines 14. In a regenerative mode, the power electronics module 26 may convert the three-phase AC voltage from the electric machines 14 acting as generators to the DC voltage required by the traction battery 24. The description herein is equally applicable to fully electric vehicles. In a fully electric vehicle, the hybrid transmission 16 may be a gear box connected to an electric machine 14 and the engine 18 is not present.

In addition to providing energy for propulsion, the traction battery 24 may provide energy for other vehicle electrical systems. A typical system may include a DC/DC converter module 28 that converts the high voltage DC output of the traction battery 24 to a low voltage DC supply that is compatible with other vehicle components. Other high-voltage loads, such as compressors and electric heaters, may be connected directly to the high-voltage supply without the use of a DC/DC converter module 28. In a typical vehicle, the low-voltage systems are electrically connected to an auxiliary battery 30, e.g., a 12-volt battery.

A battery energy control module (BECM) 33 may be in communication with the traction battery 24. The BECM 33 may act as a controller for the traction battery 24 and may also include an electronic monitoring system that manages temperature and charge state of each of the battery cells. The traction battery 24 may have a temperature sensor 31 such as a thermistor or other temperature gauge. The temperature sensor 31 may be in communication with the BECM 33 to provide temperature data regarding the traction battery 24.

The vehicle 12 may be recharged by a charging station connected to an external power source 36. The external power source 36 may be electrically connected to electric vehicle supply equipment (EVSE) 38. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically connected to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34.

The various components discussed may have one or more associated controllers to control and monitor the operation of the components. The controllers may communicate via a serial bus, e.g., Controller Area Network (CAN), or via dedicated electrical conduits. The vehicle 12 of FIG. 1 is merely an example and this disclosure is relevant to any vehicle having a traction battery.

Figure 2:
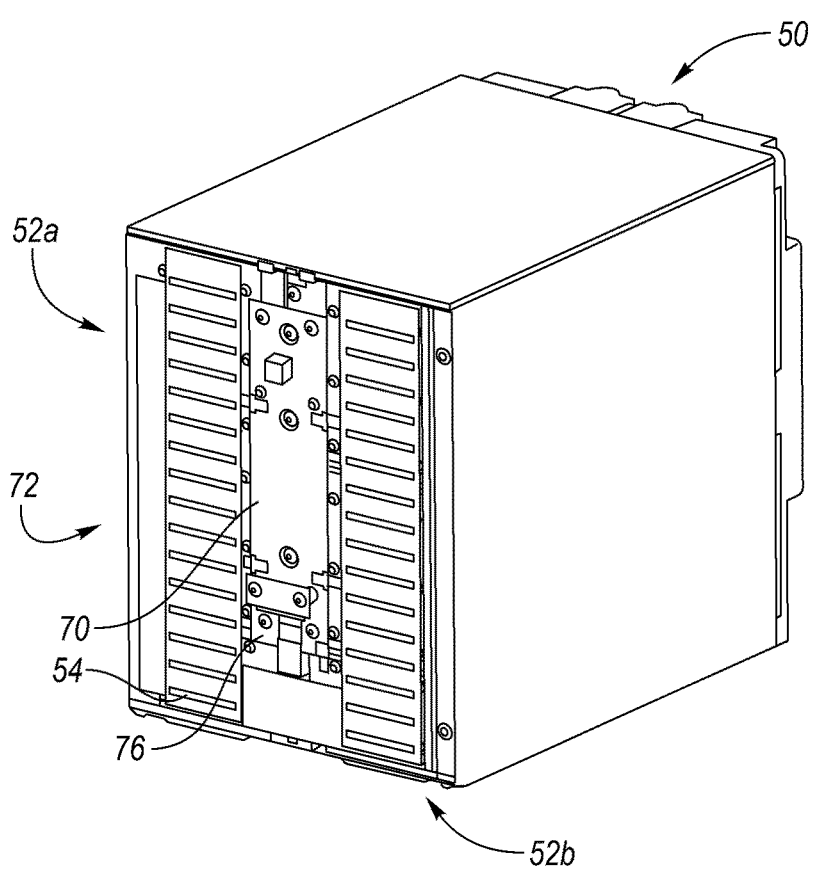
FIG. 2 is a perspective view of a traction battery assembly.
Figure 3:
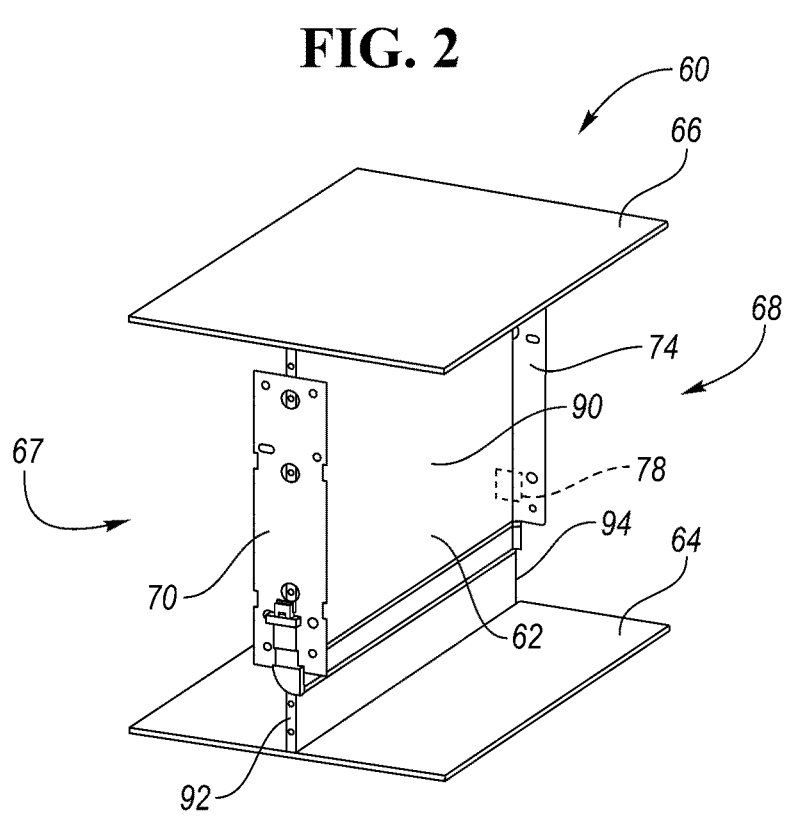
FIG. 3 is a perspective view of a support structure, a flexible printed circuit (FPC), and circuit boards of the traction battery with other components omitted for illustrative purposes.

Referring to FIGS. 2 and 3, a traction battery assembly 50 includes a plurality of battery cells 54 stacked into a battery array 52, e.g., linear arrays. Terminals 61 extend from the cells. Each cell 54 may have two terminals 61, e.g., a positive terminal and a negative terminal. The positive and negative terminals may be side-by-side or extending from different sides of the cell, e.g., opposing.

The traction battery 50 may include a support structure 60 having a central plate 62, a bottom plate 64, and a top plate 66. The plates may be arranged in a general I-shape. A first of the arrays 52a may be disposed on a first side 67 of the plate 62 and a second array 52b may be disposed on the second side 68 of the plate 62. The first and second arrays may be electrically connected in series or parallel.

One or more circuit boards may be provided on the ends 72 of the battery assembly 50. For example, a first circuit board 70 is provided on one side of the battery assembly 50 and another circuit board 74 is provided on the other side of the assembly 50. As shown, the circuit board 70, 74 are provided on opposite sides of the plate 62. A temperature sensor 76 may be mounted to the first circuit board 70 an electrically connected to leads of the circuit board 70. The sensor 76 is configured to measure a temperature of one or more of the cells 54. The second circuit board 74 may have another temperature sensor (not visible). In one or more embodiments, each circuit board may include multiple associated temperature sensors. The temperature sensors are electrically connected to a sensing module 78 that receives data from the sensors. Each of the circuit boards may also include associated current and/or voltage sensors (not shown).

A flexible printed circuit (FPC) 80 is connected between the two circuit boards 70 and 74. This is just one example, and the FPC 80 may be electrically connected between any suitable electronics on different sides of the battery 50. The FPC 80 allows data collected from one side of the battery to be conveyed to the circuit board on the other side of the battery. For example, the sensing module 78 may be located on only one of the circuit boards. Thus, data from the temperature sensor 76 may be carried to the sensing module 78 via the FPC 80. This is just one example, and the FPC may carry any number of different data.

Referring to FIGS. 3, 4, 5, 6, 7, and 8, the FPC 80 has a flexible substrate 82 that is planar and has opposing first and second planar surfaces 84, 86 and opposing first and second edges 88, 90 extending between the planar surfaces. The substrate may be hurdle shaped. The substrate 82 may have a straight middle portion 100, a first end portion 102 that is joined to the middle portion 100 by a first elbow portion 104, and a second end portion 106 that is joined to the middle portion 100 by a second elbow portion 108. A connector 110 is attached to the end portion 102, and a connector 112 is attached to the end portion 106. The connectors 110, 112 are configured to electrically connect with associated electronic componentry such as the circuit boards 70, 74. For example, the circuit boards 70, 74 may have mating connectors configured to engaged with the connectors 110 and 112.

The elbows 104, 108 may be bent such that an angle defined between the first edge 88 of the first end portion 102 and the first edge 88 of the middle portion 100 is between 80 to 100 degrees, e.g., 90 degrees as shown. A circuit 98 supported by the substrate 82 and electrically connected between the connectors 110 and 112. The circuit 98 includes a plurality of conductors 113 each extending between corresponding pins of the connectors 110, 112. The conductors may be parallel to each other.

Figures 7, 8:
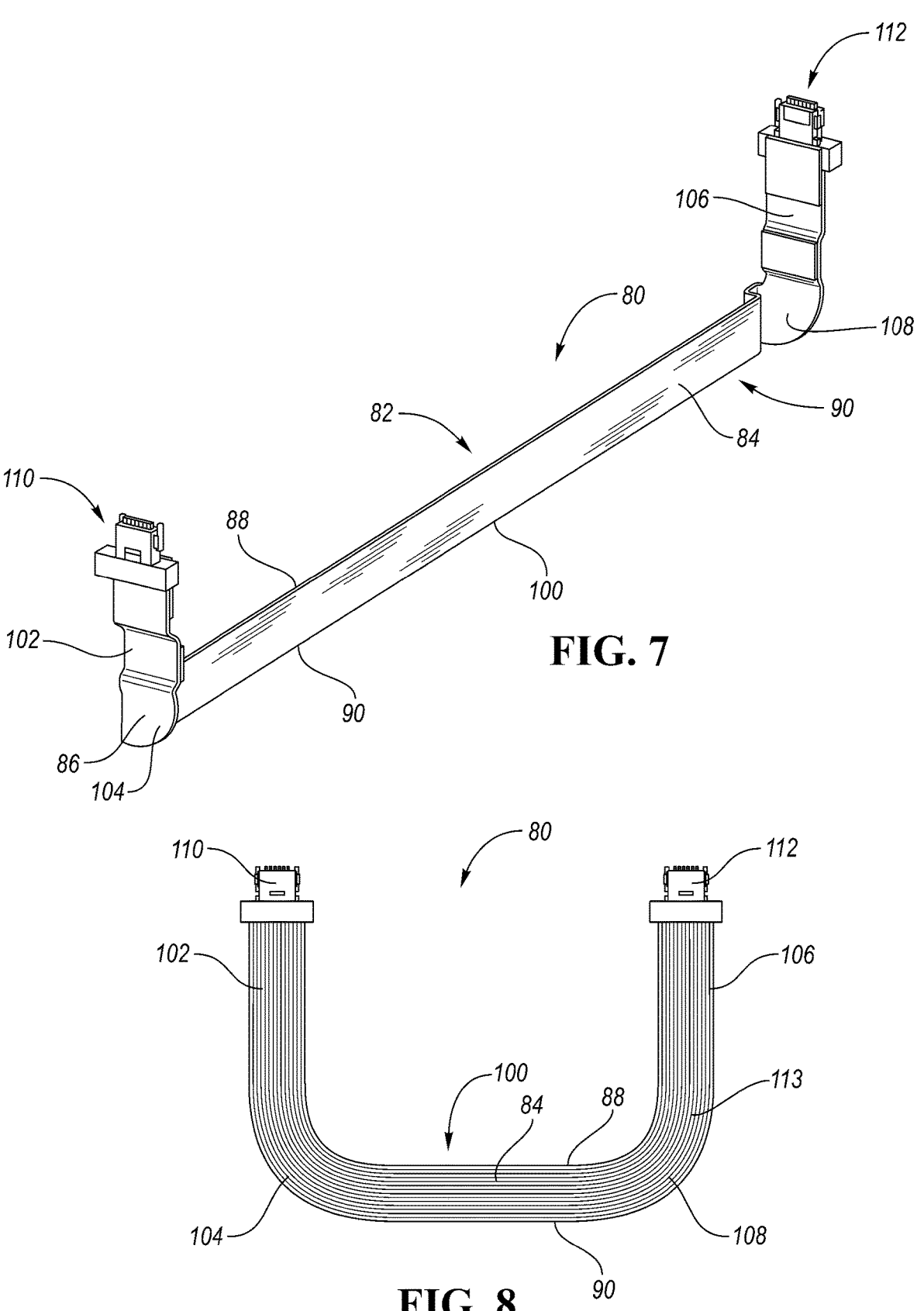
FIG. 7 is a perspective view of the FPC in the installation configuration.
FIG. 8 is a front view of the FPC in a blank configuration.

The flexible substrate 82 is foldable to provide flexible packaging. FIG. 8 illustrate an example hurdle-shaped FPC 80 in its blank shape. The blank may have other configurations in other embodiments. During assembly, the FPC blank is folded and bent as described above to the installment configuration (see e.g., FIG. 4) and is then attached to the support structure 60. The shape of the blank cooperates with the additional folds and bends to be received on the traction battery assembly in an efficient package.

The FPC 80 may be installed the traction battery 50 with the second surface 86 of the middle portion 100 disposed against a first side 90 of the plate 62. The plate 62 may define a recessed groove or channel 101 that receives the FPC 80 therein. The middle portion 100 may have U-shaped bends 114 and 120 that bulge forward of the surface 84. The bends 114 and 120 provide slack for adjustment during assembly. The bend 114 is formed by folds 116, 118, which may be 90 degrees. Bend 114 results in portions of the planar surface 86 facing each other. The bend 120 is formed by folds 122, 124, which may be 90 degrees. Bend 120 also results in portions of the planar surface 86 facing each other. The end portions 102 and 106 may also include bends to aid assembly. For example, the end portion 102 has a bend 130 that bulges from the surface 86 and results in portions of the surface 84 facing each other, and the end portion 106 has a bend 132 that bulges from the surface 86 and results in portions of the surface 84 facing each other.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to strength, durability, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A traction battery comprising:
a battery array; and
a flexible printed circuit (FPC) including:
a hurdle-shaped flexible substrate that is planar and has opposing first and second planar surfaces and opposing first and second edges extending between the planar surfaces, the substrate having a straight middle portion, a first end portion that is joined to the middle portion by a first elbow portion, and a second end portion that is joined to the middle portion by a second elbow portion, wherein the elbow portions are folded relative to the middle portion at first and second folds, respectively, such that the first planar surfaces of the first and second elbows face each other, and
a circuit supported by the substrate and electrically connected between circuit boards supported on opposite sides of the battery array.

2. The traction battery of claim 1, wherein the circuit includes a plurality of parallel conductors.

3. The traction battery of claim 1, wherein an angle defined between the first edge of the first end portion and the first edge of the middle portion is between 80 to 100 degrees.

4. The traction battery of claim 3, wherein the angle is between 87 to 93 degrees.

5. The traction battery of claim 1, wherein the straight portion includes a first bend such that the second planar surface on one side of the bend faces the second planar surface on the other side of the first bend.

6. The traction battery of claim 5, wherein the straight portion includes a second bend such that the second planar surface on one side of the second bend faces the second planar surface on the other side of the second bend.

7. The traction battery of claim 5, wherein the first bend includes a third fold and a fourth fold.

8. The traction battery of claim 1, wherein the first end portion includes third and fourth folds that form a bend such that the first planar surface on one side of the folds faces the first planar surface on the other side of the folds.

9. The traction battery of claim 1 further comprising a support structure having a first plate, wherein the array is mounted to the support structure, and wherein the second planar surface of the middle portion is disposed against the plate.

10. The traction battery of claim 9, wherein the middle portion is sandwiched between the plate and the array.

11. The traction battery of claim 9, wherein the plate defines a recessed channel, and the FPC is received in the channel.

12. The traction battery of claim 1, wherein the FPC includes a first connector and a second connector connected to corresponding connectors of the circuit boards.

13. A traction battery comprising:
a battery array;
a first circuit board disposed on a first side of the array and having an associated temperature sensor;
a second circuit board disposed on a second side of the array and having an associated sensing module; and
a flexible printed circuit (FPC) extending from the first side to the second side of the array, the FPC including:
a flexible substrate that is planar and has opposing first and second planar surfaces and opposing first and second edges extending between the planar surfaces, the substrate having a straight middle portion, a first end portion that is joined to the middle portion by a first elbow portion, and a second end portion that is joined to the middle portion by a second elbow portion, wherein each of the elbow portions are folded relative to the middle portion such that the first planar surfaces of the first and second elbows face each other, a circuit supported by the substrate, a first connector attached to the circuit and the substrate and connected to the first circuit board, and a second connector attached to the circuit and the substrate and connected to the second circuit board such that the FPC electrically connects the temperature sensor to the sensing module.

14. The traction battery of claim 13, wherein the circuit includes a plurality of conductors, each extending from the first connector to the second connector.

15. The traction battery of claim 13, wherein the first planar surface of a section of the middle portion faces the first planar surface of the first elbow.

16. The traction battery of claim 15, wherein the first planar surface of another section of the middle portion faces the first planar surface of the second elbow.

17. The traction battery of claim 13 further comprising a support structure having a plate, wherein the array is mounted to the support structure, and wherein the second planar surface of the middle portion is disposed against the plate such that the FPC is sandwiched between the plate and the array.

18. A flexible printed circuit (FPC) of a traction battery comprising:

a hurdle-shaped flexible substrate that is planar and has opposing first and second planar surfaces and opposing first and second edges extending between the planar surfaces, the substrate having a straight middle portion, a first end portion that is joined to the middle portion by a first elbow portion, and a second end portion that is joined to the middle portion by a second elbow portion, wherein each of the elbow portions are folded relative to the middle portion such that the first planar surfaces of the first and second elbows face each other;

a circuit supported by the substrate;

a first connector attached to the circuit at the first end portion; and a second connector attached to the circuit at the second end portion.

19. The FPC of claim 18, wherein the circuit includes a plurality of conductors, each extending from the first connector to the second connector.

20. The FPC of claim 18, wherein the first planar surface of a section of the middle portion faces the first planar surface of the first elbow, and wherein the first planar surface of another section of the middle portion faces the first planar surface of the second elbow.

* * * * *